United States Patent [19]

Makita

[11] 4,286,231

[45] Aug. 25, 1981

[54] SEMICONDUCTOR LASER DEVICE CAPABLE OF RADIATING A VISIBLE RAY

[75] Inventor: Yunosuke Makita, Tokyo, Japan

[73] Assignees: Agency of Industrial Science & Technology; Ministry of Intl. Trade & Industry, both of Tokyo, Japan

[21] Appl. No.: 964,124

[22] Filed: Nov. 28, 1978

[30] Foreign Application Priority Data

Nov. 28, 1977 [JP] Japan ................................ 52-141664

[51] Int. Cl.$^3$ .............................................. H01S 3/19
[52] U.S. Cl. ............................................ 331/94.5 H
[58] Field of Search ..................... 331/94.5 H; 357/18

[56] References Cited

U.S. PATENT DOCUMENTS 4,105,955  8/1978  Hayashi et al. ................. 331/94.5 H

OTHER PUBLICATIONS

Y. Makita et al., "Visible-Light Laser Oscillation in Indirect-Bandgap $Al_xGa_{1-x}As$(77K), IEEE J. of Quantum Electronics, vol. QE-13, No. 8, Aug. 1977, pp. 642-646.

*Primary Examiner*—James W. Davie
*Attorney, Agent, or Firm*—Kurt Kelman

[57] ABSTRACT

Disclosed is a semiconductor laser device capable of radiating a visible laser in which device an activation layer having an active stripe zone doped by ion-implantation of nitrogen atoms is vertically sandwiched between an overlying p-type confining layer and n-type confining layer, and the p-type confining layer is horizontally bounded by a p-n junction reverse bias layer, whereby in supplying a bias electric current through the p-type confining layer, the electric current avoids the counter bias layer to converge a flow through the active zone to the underlying n-type confining layer, thus attaining the same effect as would lower the threshold value of the luminescent semiconductor, and allowing the laser device to oscillate at an elevated efficiency in the range of visible laser.

2 Claims, 9 Drawing Figures

SEMICONDUCTOR LASER DEVICE CAPABLE OF RADIATING A VISIBLE RAY

BACKGROUND OF THE INVENTION

This invention relates generally to a semiconductor laser device which is capable of generating a visible ray at an increased efficiency and a method of making the same. More specifically, this invention relates to a semiconductor laser device which is essentially made of a substance of an indirect-transition type band structure, inherently having a very poor capability of radiation, such substance being modified by ionimplantation of nitrogen atoms, and which device is so constructed as to cause the flow of bias current to converge to the nitrogen-implantation part of the device, thus generating a visible laser at an elevated efficiency.

Almost all the laser devices hitherto known radiate infrared rays, which are of relatively long wavelength. This is attributable to the use of GaAs and other semiconductor materials of the chemical compounds of the III–V families which, although known as optoelectronics materials of high luminescent performance convenient for use in light-emitting diodes, semi-conductor lasers and other luminescent devices, have a band structure of narrow energy gap.

In order to cause the radiation of a visible laser from a chemical compound of the III–V families it is necessary to select a material of large energy gap (2 or more electron volts). Almost all the materials that meet this requirement are of indirect-transition type band structure and therefore cannot generate luminescence at an elevated efficiency. There are two different solutions to improve the efficiency of radiation.

One is to select a material which readily emits luminescence in spite of its small energy gap and add to the so-selected material a proper amount of indirect-transition type semiconductor material of a large energy gap, thus converting the material to a direct-transition type semiconductor. This remedy, however, disadvantageously limits the selection of a substrate to be modified and the ratio of mixed crystal.

The other solution is to put a luminescence center-constituting impurity in a crystal which may be of relatively low luminescent performance, thus converting the material to a substance of high luminescent performance. Indeed, light-emitting diodes made of GaP doped with nitrogen atoms have been produced and used. Also, laser oscillation has been caused by the agency of nitrogen atoms in $GaAs_{1-x}P_x$. The inventor doped an $Al_xGa_{1-x}As$ with nitrogen atoms according to the ion-implantation method, with a view to allowing the atoms to behave as isoelectronic impurities in the crystal and to constitute an effective luminescent center. The inventor observed the visible laser from the so-made semiconductor laser device and determined the luminescent efficiency to be nearly 1000 times as large as the conventional indirect-transition type luminescent semiconductor.

No impurities other than nitrogen atoms have been hitherto known and used for optically activating an indirect-transition type semiconductor material so as to increase the luminescent efficiency. Also, no method other than the ion-implantation method has been hitherto known and used for doping a semiconductor material with nitrogen atoms. In the course of ion-implantation of impurities, however, the semiconductor material will be inevitably exposed to the atmosphere, thus causing an oxide film to appear on the material, and the so-formed oxide film will prevent another layer from growing on the semiconductor, thus making it difficult to build a heterojunction structure. Still disadvantageously, in the activation layer which has been formed by ion-implantation there remains some defects in the crystal lattice caused by the ion-implantation which cannot be completely reduced by annealing. The remaining defects will become centers of non-radiative recombination and adversely reduce the optical activation. As a consequence the requirements for laser oscillation will become difficult to satisfy, and the threshold value of laser oscillation will disadvantageously rise. A solution to this problem is to invent a new laser structure having a layer capable of confining carriers and hence photons therein in such a way that the concentration or density of photon-carriers rises in an activation zone.

One object of this invention is to provide a semiconductor laser device which has a carrier-confining layer, and is capable of generating a single mode of visible ray, excited above a relatively low threshold value of laser oscillation, at a luminescent efficiency 1000 times as large as a conventional indirect-transition type semiconductor.

Another object of this invention is to provide a method of making the same.

SUMMARY OF THE INVENTION

In order to attain the objects above mentioned a visible ray generating semiconductor laser device according to this invention comprises: an n-type semiconductor substrate; an n-type photon-carriers confining layer lying on the semiconductor substrate; an active layer having a stripe center doped with nitrogen atoms; a p-type photon-carriers confining layer lying on the stripe center of the active layer; and a p-n junction reverse bias layer adjoining the opposite sides of the p-type confining layer.

In operation a bias electric current is supplied at the side of the p-type confining layer via an electrode connecting layer, and then the electric current, avoiding the reverse bias layer, converges and flows in the p-type confining layer. Then, the converging current flows through the underlying active stripe center zone of the active layer, thus causing the same effect as would be caused by lowering the threshold value of a luminescent semiconductor having an indirect-transition type band structure, and causing the laser device to radiate a laser at an increased efficiency.

Thanks to the structure of the semiconductor laser device according to this invention, photolithography, epitaxial and other semiconductor techniques can be equally and advantageously used to produce the semiconductor laser device.

Other objects and advantages of this invention will be understood from the following description which is to be made with reference to the drawings attached hereto.

DETAILED DESCRIPTION OF THE INVENTION

Figure 1:
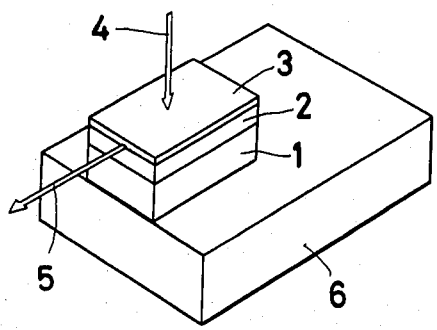
FIG. 1 is a perspective view of a model of a light-pumping type, visible ray generating semiconductor laser device which was proposed by the inventor prior to this invention.

Prior to the completion of this invention the inventor observed that an indirect-transition type semiconductor laser device when subjected to light excitation, generated a visible ray at an elevated efficiency, and this invention is based on this observation. The laser device as used comprised a GaAs substrate 1, a confining layer 2 lying on the substrate, and an active layer 3 which was composed of indirect-transition type $Al_xGa_{1-x}As$ (x=0.46), 1 micron thick, doped by ion-implantation of nitrogen atoms ($10^{18}cm^{-3}$), as shown in FIG. 1. When, the single heterojunction structure was exposed to the pumping light 4 of the strength of the light above $7 \times 10^4 W/cm^2$, a single mode of visible laser was radiated. A heat sink 6 was fixed to the laser device to dissipate the heat accompanying the laser when radiated (See the relevant paper published in IEEE J. QUANTUM ELECTRONICS QE-13, No. 8,642 (1977)).

The reason for adopting the ion-implantation method to form a nitrogen-doped active layer is that otherwise, in the course of liquid phase or vapor phase epitaxial growth, nitrogen atoms are introduced in the form of gallium nitrogen particles or in the form of ammonia gas with the result that agglomerations of gallium nitrogen particles appear in the crystal, thus preventing the formation of a complete mixed crystal of $Al_xGa_{1-x}As$. Therefore, the introduction of nitrogen impurity cannot be performed without using the ion-implantation method, which has no connection to the chemical equilibrium with regard to AlGaAs. In producing an electric current exciting type semiconductor laser device having an active layer of a nitrogen-containing $Al_xGa_{1-x}As$, the material will be inevitably exposed to the atmosphere before being put into an ion-implantation apparatus. When the wafer of $Al_xGa_{1-x}As$ is exposed to air, a film of $Al_2O_3$ will appear on the wafer as a result of chemical reaction with oxygen in the surrounding air. Therefore it is very difficult for a layer of GaAs or $Al_xGa_{1-x}As$ to grow on the oxide film. As a solution of this problem a new crystal growing method must be found. Another problem is that defects in the crystal lattice which have been caused by ion-implantation cannot be completely reduced by annealing, and such defects are the cause for lowering the luminescent efficiency.

Figure 3:
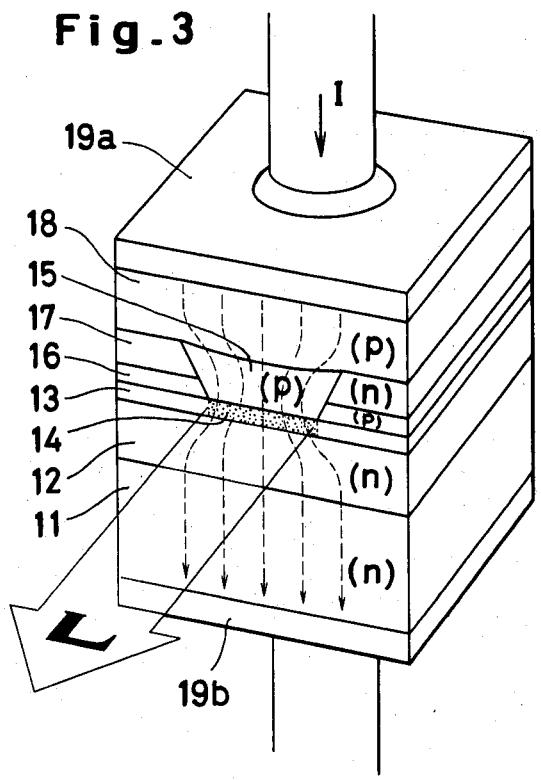
FIG. 3 is a perspective view showing one embodiment of a visible ray generating semiconductor laser device according to this invention.
Figure 2:
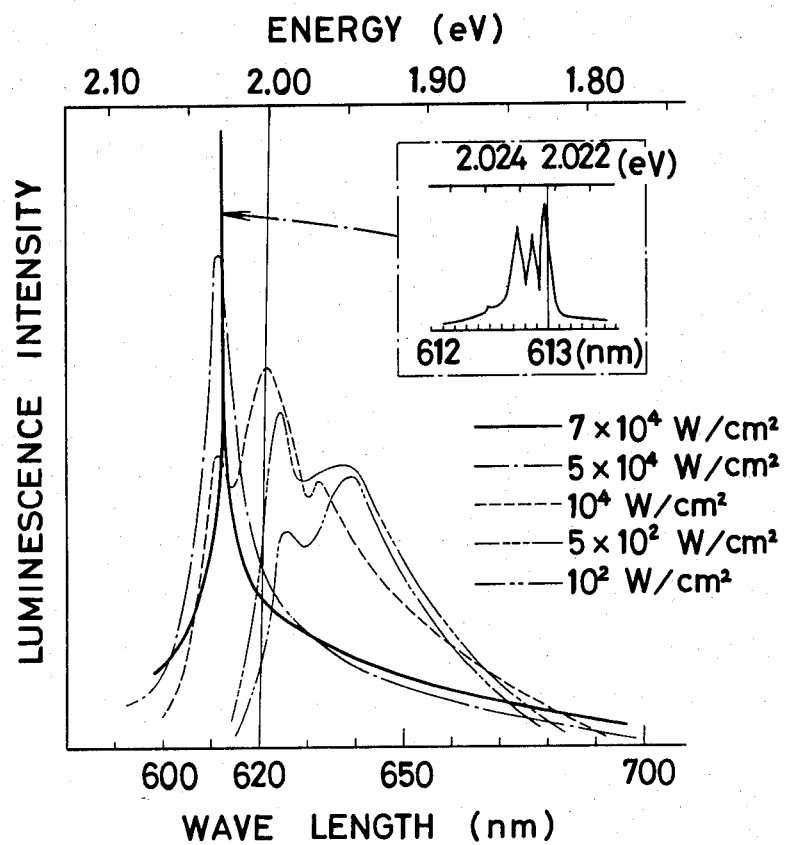
FIG. 2 is a graphic representation showing the dependency of the luminescence spectrum on the intensity of excitation.

An electric current exciting type, visible ray generating semiconductor laser device of a double heterojunction structure as shown in FIG. 3 has been completed according to this invention, and is totally free from the defects of the conventional semiconductor laser device mentioned earlier.

As shown in FIG. 3, an n-type photon-carriers confining layer 12 of $Al_xGa_{1-x}As$ (x=0.65) is formed on an n-type GaAs substrate 11, and then an active layer 13 of $Al_xGa_{1-x}As$ (x=0.45) is provided on the n-type confining layer 12. Nitrogen atoms are injected as dopants into the center part of the active layer to form an active stripe zone in the layer. A p-type photon-carriers confining layer 15 of $Al_xGa_{1-x}As$ (x=0.65) is formed on the active zone 14, and a reverse bias composite layer which is composed of a p-type and n-type GaAs sublayers 16 and 17, is formed at the opposite sides of the p-type confining layer and on the part of active layer which has not been doped with nitrogen. An electrode connecting layer 18 of GaAs is laid on the p-type confining layer 15 and the p-n junction reverse bias layer, and finally a CrAu electrode 19a is provided on the electrode connecting layer 18 and another InAu electrode 19b is provided on the lower surface of the substrate layer 11.

When a pumping electric current I is supplied through the electrode 19a, the electric current avoids the reverse bias layer of p-n junction so as to converge and flow through the carrier confining layer 15 as indicated by broken lines in FIG. 3. The convergence of electric current to the p-type confining layer will increase the current density at the selected zone, causing the same effect as would lower the threshold value of laser oscillation at the active zone 14 of the laser device. Doping the stripe zone 14 of the active layer 13 with nitrogen causes an increase in the reflective index of the stripe zone 14, relative to that of the remaining non-doped part of the active layer 13, and accordingly photons are confined to the stripe zone, increasing the density of photons, and decreasing the threshold value of the laser device.

As seen from the above, the active zone at which a laser oscillation is caused, is provided in the form of a stripe, and the overlying p-type confining layer is sandwiched between the p-n junction reverse bias layer which together function to cause the bias current to converge and direct to the stripe active zone, thus permitting the semiconductor having an indirect-transition type band structure to radiate a visible laser L at an elevated efficiency.

Referring to FIG. 4, there is shown the method of making a double heterojunction structure of semiconductor laser device.

A layer destined to be the confining layer 12, a layer destined to be the active layer 13 and a layer destined to be the reverse bias layer (sublayers 16 and 17) are formed on a substrate of n-type GaAs 11 successively in the order mentioned according to the liquid phase epitaxial method. The thickness, the ratio of mixed crystal, and the kinds of doping impurities are given in Table 1.

TABLE 1

| Components | Thickness (μm) | Ratio of mixed crystal [$Al_xGa_{1-x}As$] (x) | Concentration of impurities ($cm^{-3}$) |
|---|---|---|---|
| Electrode connecting layer 18 | 3 | 0 | p-Mg:$10^{-18}$ |
| Reverse bias layer (sublayer 17) | 1.5 | 0 | n-Te:$10^{18}$ |
| (sublayer 16) | 0.5 | 0 | p-Mg:$10^{18}$ |
| Photon-carriers confining layer 15 | ~0.5 | 0.65 | p-Mg:$10^{18}$ |
| Active layer 13 | 0.5 | 0.45 | non-doped |
| Photon-carriers confining layer 12 | ~4 | 0.65 | n-Te:$18^{18}$ |
| Substrate 11 | ~100 | 0 | n-substrate Te:$10^{18}$ |

Figure 4A:
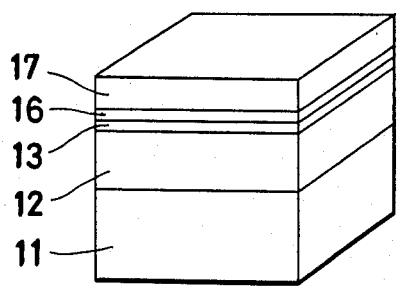
FIGS. 4a to 4f show how the semiconductor laser device as shown in FIG. 3 can be produced.
Figure 4D:
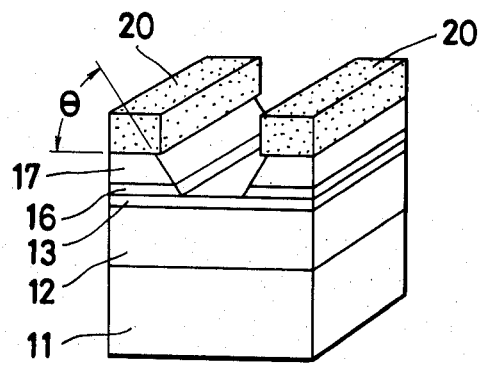
Figure 4B:
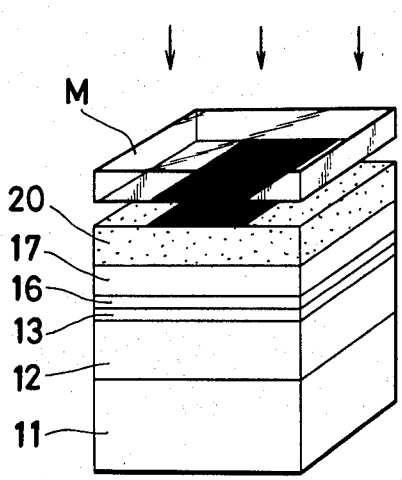

A photoresist 20 is applied to the four-layer junction GaAs-AlGaAs crystal wafer, and the photoresist coated wafer assembly is exposed to the light from a mercury lamp through a photomask M (FIG. 4b). The part of the photo-resist coating which has been exposed to the light will be insoluble, and the stripe zone of photoresist coating which has not been exposed is selectively dissolved and removed in the process of developing (FIG. 4c). The wafer thus treated is subjected to chemical etching with for instance, a solution of $H_2SO_4:H_2O_2:HOCH_2CHOH=1:5:20$, and a center stripe zone is removed from the reverse bias composite layer 16 and 17 (FIG. 4d). The open angle $\theta$ of the stripe channel is 54.74° relative to the longitudinal dimension of the stripe perpendicular to the cleavage plane of GaAs.

Figure 4E:
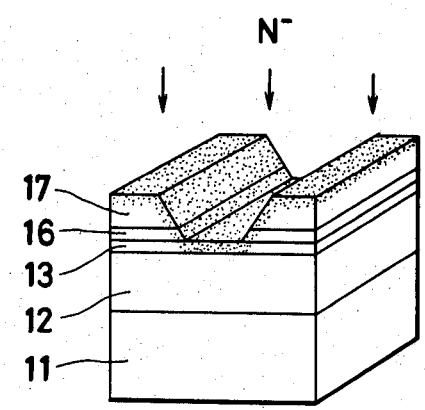
Figure 4C:
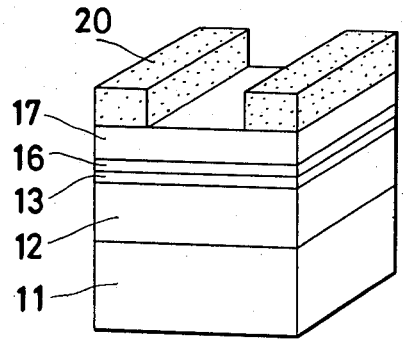

The photoresist coating 20 is removed by remover fluid, and the ion-implanation is then performed (FIG. 4e).

As an example of ion-implantation, a hot ion-implantation was performed at 350° C. The concentration of nitrogen ions was $10^{18} cm^{-3}$, and the acceleration energies were 40~250 KeV. The accelerated nitrogen ions invaded the layer material to a depth of 0.5 $\mu m$.

Figure 4F:
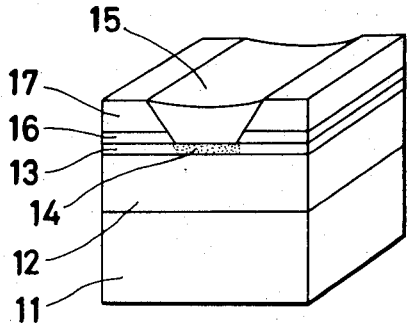

A p-type confining part 15 and an overlying electrode connecting layer 18 were grown according to the liquid phase epitaxial method. The confining layer 15 started growing at the opposite side walls of the stripe channel, and then it grew on the nitrogen ion-implanted zone of the active layer 13. The final shape of the confining layer thus formed was somewhat concave as shown in FIG. 4f. A GaAs layer was grown on the confining layer 15 to provide an electrode connecting layer 18. While these layers were growing, the ion-implanted zone 14 was automatically annealed (the growing temperature: about 800° C.), and the layer 13 was optical-activated to constitute an active zone 14. The reverse bias composite layer 16, 17 was partly ion-implanted, and adversely modified. The defects in the crystal lattice caused by the ion-implantation were almost completely eliminated by annealing, but a small defect still remained, constituting a high resistance area. This, however, did not cause an adverse effect because it functions to confine the electric current in the selected area of confining layer.

The substrate 11 was subjected to machining until the total thickness of the composite wafer reached 100 $\mu m$. Then, In-Au and Cr-Au were vapor-deposited on the substrate 11 and the electrode connecting layer 18, thus providing electrodes 19a and 19b. The laminated wafer was sliced to the longitudinal direction of the stripe channel, to provide numerous laser dies each 100-20 $\mu m$ thick and each die is then subjected to cleavage treatment at the plane perpendicular to the longitudinal direction of the stripe channel to produce a visible semiconductor-laser device as shown in FIG. 3.

As is apparent from the above, a stripe active zone and opposite reverse bias layer according to this invention permit the stable laser oscillation of a visible ray generating semiconductor laser device, which stable operation has been thought impossible before the completion of this invention.

The laser radiating active stripe (20 $\mu m$ wide) is narrow enough to cause a single mode oscillation thereacross, and the laser device according to this invention can be advantageously used for optical modulation. A semiconductor laser device according to this invention is small in size, and the laser radiated therefrom is visible. Therefore, it can easily be handled with safety, and it can be used for different display purposes. It can be used as a light source for a visible holographic apparatus or a copying machine because photosensitive sheets and photodetectors are very sensitive to visible ray. Also by taking advantage of the fact that the visible laser is of short wavelength so that the laser beam can sufficiently be focused, it is possible to advantageously apply the laser device according to the present invention to writing in and reading out information from a video-disc capable of dense information storage. A visible ray will scatter and will accordingly undergo considerably more loss in traveling the length of a quartz fiber than will an infrared ray. The scattering loss, however, is not intolerably large in short distance transmission. So, the frequency of the visible ray, which is higher than that of the infrared ray, can be advantageously used for transmitting relatively high density information. The semiconductor laser device according to this invention can be advantageously used as a light source for short distance communication. The method of making a semiconductor laser device according to this invention is unique in that it allows the epitaxial growth to start from the GaAs side walls of the stripe channel and extend onto the bottom thereof, thus permitting the epitaxial growth on the oxide surface.

What is claimed is:

1. In a semiconductor laser device capable of radiating a visible laser beam, comprising: an n-type semiconductor substrate layer; an n-type photon-carriers confining layer lying on the substrate layer; an active layer lying on the n-type confining layer and having an active zone formed by the ion-implantation of nitrogen atoms in the form of stripe extending across the center of the active layer; a p-type photon-carriers confining layer lying on the stripe zone of the active layer; a p-n junction reverse bias layer adjoining the opposite sides of the p-type photon-carriers confining layer; an electrode-connecting layer lying on the p-type confining layer; and a pair of electrodes, one lying on the electrode-connecting layer and the other provided on the lower surface of the substrate layer.

2. A semiconductor laser device capable of radiating a visible laser according to claim 1 wherein said semiconductor is of GaAs; said n-type photon-carriers confining layer is of $Al_xGa_{1-x}As$ (x=0.65); said active layer is of an $Al_xGa_{1-x}As$ (x=0.45); said p-type confining layer is of a p-type $Al_xGa_{1-x}As$ (x=0.65); and said reverse bias layer is composed of a p-type GaAs and n-type GaAs.

* * * * *